Nov. 20, 1962 R. N. HALL 3,065,391

SEMICONDUCTOR DEVICES

Filed Jan. 23, 1961

Inventor:
Robert N. Hall,
by Joseph V. Claeys
His Attorney.

3,065,391

SEMICONDUCTOR DEVICES

Robert N. Hall, Schenectady, N.Y., assignor to General Electric Company, a corporation of New York Filed Jan. 23, 1961, Ser. No. 84,331
10 Claims. (Cl. 317—234)

Figure 1:
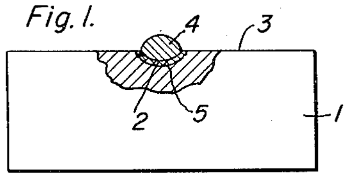

This invention relates to semiconductor devices and in particular to such devices of the "tunnel diode" type.

Tunnel diode devices, now well-known in the art, are two-terminal devices comprising a narrow space charge region such that the current at low voltages is determined essentially by the quantum mechanical tunneling process. Semiconductor devices of this type comprise a very narrow P-N junction space charge region formed between a region of P-type conductivity semiconductor, impregnated with acceptor impurity to a concentration sufficiently high that the semiconductor is rendered degenerate or approximately so, and a region of N-type conductivity semiconductor impregnated with a donor impurity to a concentration also sufficiently high to render the semiconductor either degenerate or approximately so.

The term "tunnel diode device," as used throughout the specification and in the appended claims, is intended to denominate a device comprising a narrow P-N junction space charge region formed between two regions of heavily impregnated degenerate semiconductor of different conductivity type as well as devices in which the semiconductor in one or both of the regions is also relatively heavily impregnated but may be only approximately degenerate. In addition, such devices may comprise such a narrow P-N junction space charge region between two suitably impregnated dissimilar semiconductive materials.

All such devices of the type termed "tunnel diode devices" are further characterized in that the current at low voltages is determined essentially by the quantum mechanical tunneling process. Depending upon whether both regions of semiconductor are degenerate, or one or both are only approximately so, the device may or may not exhibit a region of negative resistance in the low forward voltage range of its current-voltage characteristic. In general, however, when both regions are degenerate the device exhibits such a negative resistance region. Devices of this type have been described in the booklet entitled "Tunnel Diodes," published in November 1959 by Research Information Services, General Electric Company, Schenectady, New York.

The use of the term "degenerate" in a semiconductive material is intended to denominate a body or region of such material, which if N-type, has substantially all of the states near the bottom of the conduction band occupied by electrons as shown on the Fermi-level diagram for the semiconductive material. Similarly, if the semiconductive material is P-type the term "degenerate" refers to a body or region wherein substantially all of the states in an appreciable region near the top of the valance band are emptied of electrons. The "Fermi-level" in such energy level diagrams is the level at which the probability of finding an electron in a particular state is equal to one-half. Typical energy diagrams for semiconductive materials may be found on pages 78, 87, 90, 142, 164 and 165 of the text entitled "Introduction to Semiconductors" by W. Crawford Dunlap, Jr., published in 1957 by John Wiley and Sons, Inc., New York, New York.

The concentration of donor or acceptor impurity necessary to render a semiconductive material degenerate depends upon the particular semiconductive material. For example, the impurity concentration required to render germanium degenerate at room temperature is about $1 \times 10^{19}$ atoms per cubic centimeter depending to some degree upon the particular impurity material utilized.

The width of the P-N junction space charge region separating two regions of different conductivity type semiconductive material depends upon various factors as, for example, the particular semiconductive material and the concentration of donor and acceptor impurity in the respective regions thereof. For example, the P-N junction space charge region formed between a region of degenerate P-type and a region of degenerate N-type conductivity germanium is usually less than about 200 angstrom units wide. When the space charge region in a semiconductor device is sufficiently narrow, the current at low voltages therein is determined essentially by the quantum mechanical tunneling process. Such a device, therefore, is to be distinguished from other known P-N junction semiconductor devices in which the current at low forward voltages is determined essentially by the injection of minority carriers.

Devices comprising such a narrow P-N junction space charge region formed between two regions of degenerate semiconductor of different conductivity type ordinarily exhibit a region of negative resistance in the low forward voltage range of their current-voltage characteristics. When one or both of the regions are only approximately degenerate the device may exhibit only a very weak negative resistance region or none at all.

A semiconductor body or region is referred to herein as "approximately degenerate" when, although the impurity concentration therein is less than that required to render the body or region degenerate, the P-N junction space charge region formed between two such regions, or between one such region and a degenerate region, is sufficiently narrow that the current at low voltages is determined essentially by the quantum mechanical tunneling process.

It is known that the capacitance of a P-N junction space charge region varies inversely with the width thereof. For this reason semiconductor devices of the type to which this invention relates are found to exhibit a high shunt capacitance. For example, such devices have greater capacitance per unit area of junction region than is the case with other known P-N junction semiconductor devices operating by minority carrier injection at low forward voltages.

As used throughout the specification and in the appended claims the term "narrow" as applied to a P-N junction refers to the width of the space charge region separating adjacent regions of opposite conductivity type normal to the plane of the P-N junction.

Because of the high shunt capacitance of semiconductor devices of this type, inductance due to the electrodes may become very undesirable in many applications. For example, this electrode inductance in combination with the shunt capacitance of the device itself is particularly objectionable when the device is intended for high frequency applications. Electrode inductance places an undesirable limitation upon the maximum frequency at which such a device may be utilized.

By fabricating the device with a P-N junction region which has a relatively small area, the shunt capacitance thereof may be kept acceptably small for many applications. To achieve still better electrical properties the P-N junction may be further reduced after its formation such as by the method disclosed and claimed in the copending application of J. J. Tiemann, Serial No. 74,815, filed December 9, 1960, which is a continuation-in-part of application Serial No. 858,995, filed December 11, 1959, and now abandoned, and which is assigned to the assignee of the present invention. In the method disclosed in the above application the P-N junction region is reduced to a very small size by a controlled and monitored preferential etching treatment. Such small area P-N junction regions are extremely fragile and thus many difficulties have been encountered in providing a suitable low inductance, mechanically strong electrode thereto which does not introduce strains or otherwise cause damage to the small area P-N junction.

It is an object of this invention, therefore, to provide a new and improved electrode arrangement which substantially reduces the lead inductance normally associated with prior art semiconductor devices of this type.

It is another object of this invention to provide an improved tunnel diode device having large area electrodes which is suitable for operation at extremely high frequencies.

It is another object of this invention to provide a tunnel diode device wherein the electrode arrangement contributes to its utilization in microminiaturization applications.

It is another object of this invention to provide a tunnel diode device adapted for operation at high electrical frequencies having an electrode arrangement which reduces difficulties of construction in the manufacture thereof.

It is still another object of this invention to provide an electrode arrangement for a tunnel diode device, having a small area P-N junction region, which introduces low inductance and capacitance and has good mechanical strength.

Briefly stated, in accordance with one aspect of this invention, a tunnel diode device comprises a body of semiconductive material of one-type conductivity having within a surface adjacent portion thereof a regrown region of opposite-type conductivity, a dielectric layer deposited upon the semiconductor surface surrounding the regrown region and a continuous metal layer deposited upon the dielectric layer and upon the regrown region.

When a device is desired which is particularly adapted for operation at extremely high frequencies the capacitance of the deposited layers is made small as compared to the P-N junction of the device itself.

Figure 2:
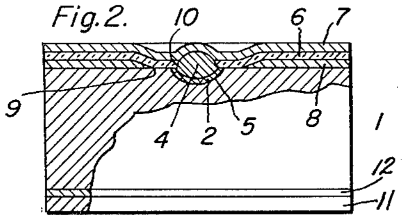
Figure 3:
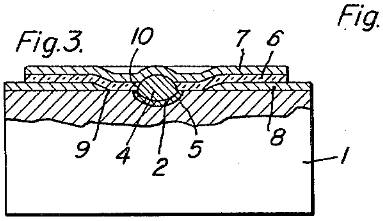
Figure 4:
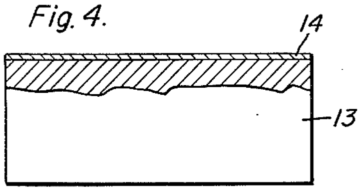
Figure 5:
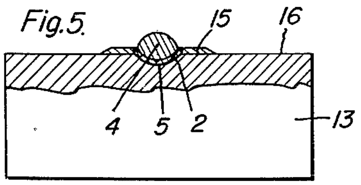
Figure 6:
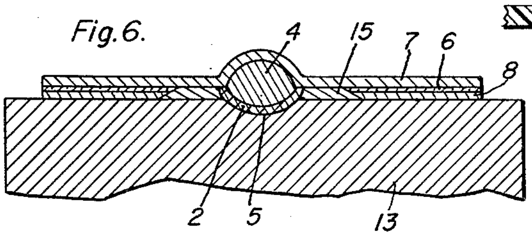
Figure 2A:
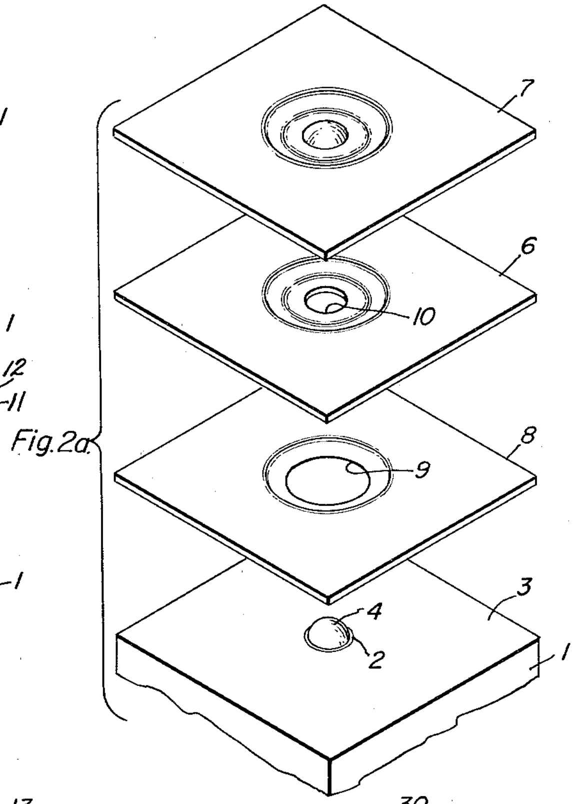
Figure 7:
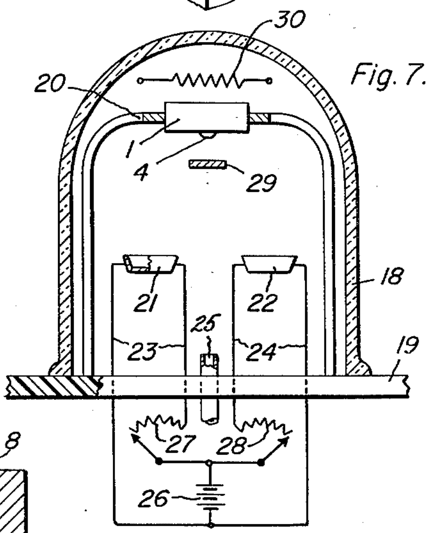

The features of my invention which I believe to be novel are set forth with particularity in the appended claims. My invention itself, however, both as to its organization and method of operation together with further objects and advantages thereof may best be understood by reference to the following description taken in conjunction wtih the accompanying drawing in which:

FIG. 1 is a vertical sectional view of a tunnel diode device in an intermediate stage of fabrication, FIG. 2 is a partly sectional view of one embodiment of a tunnel diode device constructed in accordance with this invention, FIG. 2*a* is a greatly enlarged exploded view showing the configuration of the various layers making up the electrode structure of the device shown in FIG. 2, FIG. 3 is a view, partly in section, illustrating an electrode configuration in accordance with another embodiment of this invention, FIGS. 4–6 are views, partly in section, illustrating another embodiment of this invention at various stages in the fabrication thereof; and FIG. 7 is a schematic illustration of one type of apparatus suitable for use in the fabrication of the device of this invention.

For purposes of clarity and simplicity of description, the invention will be described in detail in connection with a semiconductor device in which the semiconductive material is degenerate N-type conductivity germanium having a degenerate P-type conductivity regrown region therein. It will be readily understood, however, that the semiconductor body may be either N or P-type and that either one or both of the regions may be only approximately degenerate. In addition, the semiconductor body may be of other materials than germanium such as, for example, silicon, silicon carbide, group III–V compounds, group II–VI compounds and the lead sulfide family of semiconductors.

In FIG. 1 there is shown a semiconductor body 1 of degenerate N-type germanium, having been impregnated with a donor impurity such as phosphorus, for example, which has a solubility in germanium sufficient to render the body degenerate. A small regrown region 2 of P-type conductivity is formed in a portion of body 1 adjacent surface 3 thereof. This regrown region may be conveniently formed by conventional alloying and recrystallizing techniques. For example, a very small pellet 4 of a suitable acceptor impurity having a solubility in germanium sufficient to render it degenerate and of opposite-type conductivity is placed on surface 3. An example of a suitable acceptor impurity material for this purpose is indium with about 2 atom percent gallium. The assembly is heated to fuse the pellet 4 to the surface 3 of semi-conductor body 1 to form the regrown region 2 in known manner. Pellet 4 is thereby alloyed to and protrudes from the regrown region 2. While the protruding pellet 4 may be of advantage in many instances it is to be understood that this protruding portion is not necessary to the further fabrication of the device in accordance with this invention. Alloyed pellet 4 may, therefore, be removed from the surface 3 of semiconductor body 1, if desired, in any convenient manner known to the art such that the regrown region is disposed substantially in or below the plane of surface 3. Alternatively, depending upon the particular fabrication techniques employed, little or no alloyed portion may initially protrude from the regrown region. For example, the impurity material may be placed on the surface of semiconductor body 1 in liquid, solid or vapor form, the important feature in the formation of the regrown region being the appropriate heating of the impurity material in contact with the body 1.

The two regions of different conductivity type are separated by a P-N junction space charge region 5. Since both regions have been very heavily impregnated with impurity material sufficient to render them degenerate this P-N junction space charge region is very narrow such that the current in the device at low voltages is determined essentially by the quantum mechanical tunneling process.

The regrown region 2 and, hence, the P-N junction region is of a relatively small area, being formed substantially entirely under the very small pellet 4 of acceptor impurity material. The area of the P-N junction is made small since in a semiconductor device of this type, having a very narrow P-N junction region, the capacitance per unit area thereof is considerably larger than is the case for a P-N junction such as is established in other known semiconductor devices of the type wherein the current at low forward voltages is determined essentially by the injection of minority carriers. By fabricating the device with a small P-N junction area, therefore, the shunt capacitance of the device may be made acceptably small.

Although a wire electrode in suitable contact with the alloyed pellet 4, as is conventional, may be satisfactory for many low power, low frequency applications, a tunnel diode device having such an electrode structure is far from satisfactory, for example, for high power applications at frequencies of about 100 megacycles and more or for low power applications at frequencies of about 1000 megacycles and more.

According to this invention, therefore, a tunnel diode device is provided having large area, low inductance electrodes with good mechanical strength and without the introduction of strain or damage to the small area P-N junction region therein. In addition, by the present invention a semiconductor tunnel diode device is provided which is adapted for operation at extremely high electrical frequencies.

A tunnel diode device constructed in accord with one embodiment of this invention is shown in FIG. 2. Such a structure is provided by depositing a suitable dielectric layer 6 on the surface 3 of the semiconductor body surrounding the regrown region 2 and depositing upon this dielectric layer and upon the regrown region 2 a continuous metal layer 7. Preferably, a metal base layer 8 is first deposited on the surface 3 of the semiconductor body, out of contact with the regrown region 2, prior to the above described further deposits. The base layer 8 serves as a ground plane and in addition may be utilized as the other electrode of the device as will be described in more detail hereinafter.

FIG. 2*a* illustrates a suitable configuration for the deposited layers 6–8 respectively to provide such an electrode structure in the device of FIG. 2. As shown in the enlarged exploded view therein, metal base layer 8 is maintained out of contact with regrown region 2 by the utilization of a suitable technique, as for example, masking to prevent the deposit of metal in the vicinity of the regrown region 2. This results in base layer 8 having an aperture 9 of a suitable size to prevent electrical conduction between the base layer 8 and the regrown region 2. Utilizing similar masking techniques, dielectric layer 6 is provided with an aperture 10 therein of a size to assure that the major portion of the regrown region 2 is free of such dielectric material. The final metal layer 7 is continuous as shown and adheres intimately to the dielectric layer 6 and alloy pellet 4 which is in ohmic electrical contact with regrown region 2.

Appropriate operating connections may be made to the large area, mechanically strong electrode conducting layers 7 and 8 or to the conducting layer 7 and a large area electrode 11 which may be, for example, a metal base plate connected in nonrectifying contact to the body 1 by means of a suitable solder 12. In such a device for example, connections may be made at the regions remote from the small area regrown region 2. In addition, by suitable selection of dielectric material and thickness of the deposited layer 6, the capacitance due to the electrode arrangement may be made small compared to the capacitance of the P-N junction itself thereby providing a device particularly adapted for operation at extremely high electrical frequencies.

FIG. 3 illustrates another configuration of the various layers to achieve a tunnel diode device having appropriate large area mechanically strong electrodes. As shown therein the dielectric layer 6 and conducting metal layer 7 are made smaller than metal base layer 8 by utilizing appropriate masking techniques. As before, metal base layer 8 is in nonrectifying contact with the bulk portion of semiconductor body 1 while metal layer 7 is in nonrectifying electrical connection with the regrown region 2. The two metal layers are separated by dielectric layer 6. These two metal layers, therefore, constitute the two electrodes of the device as described hereinbefore. Since metal layer 8 extends beyond the dielectric layer 6 and metal layer 7, appropriate operating connections may be very conveniently made to the device.

FIGS. 4 and 5 illustrate a semiconductor device during intermediate stages of construction to provide the embodiment shown in FIG. 6.

In FIG. 4 there is shown a semiconductor body including a region 13 of degenerate semiconductive material, such as degenerate N-type conductivity germanium as before, and a thin higher purity region 14. Region 14 should be thin enough to allow for the formation of a degenerate regrown region of opposite-type conductivity with the region 13 by alloying of impurity therethrough. For example, a suitable higher purity region 14 may be conveniently in the range from about one to 20 microns in thickness and with an impurity concentration 10 or more times less than that in region 13.

The higher purity region 14 may be established in any convenient manner known to the art, as for example, "out diffusion" or epitaxial growth methods. For example, impurity may be "out diffused" in well-known manner to reduce the impurity concentration in a thin surface-adjacent region of the degenerate semiconductor body to obtain the desired resistivity therein. Alternatively, the higher purity region 14 may be epitaxially grown on one surface of the degenerate semiconductor body. Such epitaxial growth is also well known in the art further details of which may be had by reference to the article "Epitaxial Films of Silicon and Germanium by Halide Reduction" by H. C. Theurer et al. in the Journal of The Electrochemical Society, vol. 107, No. 12, December 1960, on page 268C.

The assembly shown in FIG. 4 including adjacent regions 13 and 14 is then shaped as shown in FIG. 5 to establish a mesa-like portion 15. The mesa-like portion 15 includes the high purity region 14 while the remainder of the body comprises the region 13 and is of degenerate material. The configuration of FIG. 5 may be provided in accordance with well-known techniques such as those utilized in the construction of mesa-type transistors and the like. For example, such a mesa-like portion as that shown at 15, may be conveniently obtained by subjecting the assembly shown in FIG. 4 to a preferential chemical or electrolytic etching treatment. Such preferential etching techniques are so well-known in the art that further detailed description thereof is deemed unnecessary herein.

A degenerate regrown region 2 of opposite-type conductivity is established in a small portion of the degenerate region 13 underlying the mesa-like portion 15 of the higher resistivity region 14. Since the regrown region 2 and the region 13 are both degenerate and of different-type conductivity, they are separated by a very narrow P-N junction space charge region 5. The degenerate regrown region 2 may be formed, as described in detail hereinbefore, by heating a small quantity of an appropriate conductivity-imparting impurity to contact with the surface of the mesa-like portion 15 for a time and at a temperature sufficient to assure the alloying of the impurity through the higher purity region 14 and into the degenerate region 13 is well-known manner. For example, in such an alloying procedure the impurity penetrates to a depth which depends upon the time and temperature of heating. For a germanium body, for example, having a region 14 of about 1 micron in thickness and utilizing an impurity material of indium and gallium, heating at about 600° C. for a period of about a few seconds provides a suitable degenerate regrown region 2. The device is now in condition for final fabrication whereby the electrode structure of low inductance and good mechanical strength is provided.

The embodiment of this invention, shown greatly enlarged in FIG. 6, simplifies the fabrication and provides for less critical requirements in masking to assure that the base metal layer 8 is maintained out of electrical contact with the regrown region 2. In the embodiment shown in FIG. 6, a base metal layer 8 is deposited on the surface 16 of the degenerate region 13 which surrounds the mesa-like portion 15. Preferably in this embodiment, the metal is selected to be one whose oxide is a good dielectric material such as aluminum or tantalum, for example. After the deposition of the metal base layer 8, oxidation of its surface is effected in any convenient manner known to the art to provide the dielectric layer 6. This oxidation may be effected conveniently, for example, by heating in the presence of air or oxygen, or by electrolytic anodization. A final continuous metal layer is then deposited upon the oxidized metal base layer 8, the mesa-like portion 15 and alloyed portion 4, respectively. It will be readily apparent that in the embodiment of FIG. 6 the oxidizable metal layer 8 may also be deposited upon a portion of the surface of the region 15 if desired, after which the metal layer is oxidized to provide the dielectric layer 6. Alternatively, the metal base layer 8 may be deposited upon the appropriate regions of the semiconductor body, the separate alternate dielectric and metal conducting layers, 6 and 7 respectively, being deposited as in the embodiments described in detail in FIGS. 2 and 3.

The preferred construction of the embodiment of FIG. 6 is possible since the surface adjacent region of the mesa-like portion 15 is of higher purity material. The oxidized surface of metal base layer 8 therefore and the high resistivity portion of region 15 provide suitable insulation between the continuous metal layer 7 and the degenerate portion 13 of the body.

From the foregoing description, it will be readily apparent that other specific electrode layer configurations may be utilized. In addition, metal base layer 8 may be advantageously subjected to a suitable heat treatment after its deposition on the surface of the semiconductor body, alloying the layer thereto, to achieve improved electrical and mechanical characteristics.

The dielectric material for layer 6 is preferably chosen to be of a material which may be readily evaporated to form a uniform film substantially free of imperfections such as pin holes and the like and one having a relatively low dielectric constant. The dielectric material may be, for example, manganous or magnesium fluoride or silicon monoxide or dioxide or the oxide of the metal comprising layer 8. A great variety of other dielectric materials are suitable some other examples being zinc sulfide, cryolite, aluminum oxide and polystyrene. The dielectric layer should be thick enough to withstand the required peak voltage and in addition provide a suitably low capacitance to assure that the capacitance due to the electrode structure may be made small compared to the capacitance of the P-N junction of the device itself.

The conducting metal films should be thick enough to provide satisfactory low resistance. For example, for electrical purposes the resistivity of a suitable conducting layer should ordinarily be about 0.1 ohm per square or less. The conducting layers, therefore, may have a thickness of about 1 micron or more. The metal is selected to be easily evaporated and may be, for example, such materials as silver, gold, aluminum, indium, tin, platinum and tantalum. In addition, the metal should be chosen with respect to the semiconductive material of the body and the regrown region therein to assure that the conductivity type of these respective regions is not altered. For example, the metal base layer 8 which serves as a ground plane and electrode should not alter the conductivity type of body 1 and therefore establishes nonrectifying contact therewith. Similarly, the final continuous metal layer 7 deposited on the alloyed portion 4 must make nonrectifying contact therewith.

The electrode arrangement of this invention comprising alternate deposited layers on the surface of a semiconductor body in which a small area regrown region has been formed may be obtained by a variety of different methods such as, for example, vacuum evaporation and sputtering. One suitable method utilizing well-known vacuum evaporation techniques will be described only very briefly herein in conjunction with the apparatus of FIG. 7.

A tunnel diode device in accordance with one aspect of this invention, wherein the various layers of the electrode structure are vacuum evaporated upon the appropriate surfaces of the semiconductor body, may be fabricated in an apparatus such as is illustrated schematically in FIG. 7. In FIG. 7 the apparatus comprises an evacuable reaction chamber or bell jar 18 mounted upon and sealed to a suitable base member 19. The semiconductor body is mounted horizontally upon suitable supporting members 20 in a manner such that the surface thereof in which the regrown region has been formed is completely exposed and directed toward base member 19. A pair of evaporation vessels or boats 21 and 22 are mounted directly under the semiconductor device and are preferably symmetrically located with respect to the center thereof. Evaporation boats 21 and 22 are supported by conducting support members such as bus bars 23 and 24 respectively which also serve as electrical contacts thereto. Evaporation boats 21 and 22 are constructed of a high resistance refractory material such as tungsten, molybdenum, graphite or like materials, which may be heated to incandescence by the passage of an electric current therethrough. An exhaust conduit 25 passes through base 19 and is connected to an exhaust pump, not shown, to maintain a suitable low pressure atmosphere within reaction chamber 18. A source of electric power represented schematically as battery 26 is utilized to supply electric power to evaporation boats 21 and 22 through potentiometers 27 and 28 respectively. Potentiometers 27 and 28 may be utilized to supply a regulated electric current simultaneously or sequentially to evaporation boats 21 and 22. A plurality of masks, designated schematically and collectively as 29, are sequentially interposed between the semiconductor body and the evaporation boats. The masks have various appropriate configurations to assure that the respective material being evaporated covers only the desired regions of the semiconductor body. Such masks and means for positioning them within the evacuated chamber are well-known in the art and specific layer configurations such as those illustrated in FIGS. 2 and 3 may be readily provided. Alternatively, the mask may be interposed between the body and the evaporation boats and the body suitably mounted so as to be rotated during the evaporation of the respective layer. In yet another well known alternative a plurality of separate evaporation stages may be provided within the evacuated chamber and the dev'ce moved from one stage to the other to have the appropriate layer deposited thereon.

The device shown in FIG. 2 may be fabricated in accordance with one aspect of this invention utilizing the apparatus of FIG. 7. The partially fabricated device illustrated in FIG. 1, comprising the semiconductor body 1, having the regrown region 2 formed therein, is mounted in the apparatus with the surface 3 directed toward the evaporation boats 21 and 22.

The base layer 8 is first deposited upon the surface 3 of body 1 and out of contact with the regrown region 2 or the protruding pellet 4 thereof. To this end a suitable mask is interposed between this region of semiconductor body 1 and the evaporation boats 21 and 22. A quantity of a suitable metal such as gold or silver, for example, is placed in evaporation boat 21. In like manner a quantity of suitable dielectric material as, for example, silicon monoxide is placed within evaporation boat 22. Bell jar 18 is sealed to base 19 and the apparatus is exhausted to a very low pressure ordinarily no greater than approximately $10^{-4}$ millimeters of mercury.

When the suitable chosen operating pressure has been obtained, electric current is applied through evaporation boat 21 containing the appropriate metal, as for example, silver or gold, raising the temperature of the evaporation boat sufficient to cause vaporization of the metal therein. The temperature at which boat 21 is maintained for the evaporation of metal layer 8 will, of course, vary depending upon the material which is utilized and the rate of deposition desired. Such evaporation techniques are well-known to the art and will not be discussed in detail herein. In this respect it is only necessary that the evaporated layer of conducting material be sufficiently thick to provide good electrical conductivity. To assure a uniform metal layer free of pin holes and other defects and one offering greater mechanical strength it may be desirable to provide a layer of greater thickness.

After the desired thickness of the metal layer 8 has been obtained in the above described manner it may be subjected to a suitable heat treatment to cause the alloying thereof to the semiconductor body to obtain improved electrical and mechanical characteristics. To this end resistance heating element 30 is energized from a suitable voltage source, not shown. After the alloying treatment at least the major portion of the regrown region 2 is masked by substituting the mask utilized in the first operation for one of the other masks so provided. This mask has a configuration which covers the major portion of the regrown region 2. Electrical power is then supplied to evaporation boat 22 through rheostat 28 to cause the evaporation upon the metal layer 8 of a film 6 of dielectric material, in this case silicon monoxide, from evaporation boat 22. Again the temperature of the evaporation boat to vaporize the silicon monoxide or other dielectric material used will depend upon the material utilized and is maintained sufficiently high to assure the evaporation thereof.

By suitable selection of the temperature of the evaporation boats 21 and 22 and their distance below the semiconductor device, the rate of deposition of the particular material may be controlled so that a film of any desired thickness may be readily provided. After the desired thickness of the dielectric layer has been obtained by the above described operation the electrical power supply to evaporation boat 22 is interrupted at rheostat 28. Depending upon the desired electrode configuration, another suitable mask is substituted and electrical power is again supplied to evaporation boat 21. For example, if a configuration as shown in FIG. 2 is desired no further masking may be required during this evaporation. The electrical power supplied to evaporation boat 21 causes the material therein to be evaporated and deposited upon dielectric layer 6 and the alloyed portion 4 to form a continuous metal layer 7 in intimate contact with the alloyed portion 4 and separated from the metal layer 8 by the layer 6 of dielectric material.

Although the temperature of the evaporation boats required to evaporate the material therein may be high, the temperature of the semiconductor body being coated may be maintained at substantially room temperature if desired. Rapid evaporation of material and a relatively large distance between the semiconductor body and the evaporation boats does not permit the body to absorb an appreciable amount of heat. When desired, however, the semiconductor body may be suitably heated, either during part of the evaporation of base layer 8 or after its complete deposition, to cause the alloying of the metal with the surface of the semiconductor body.

From the foregoing description it is evident that a tunnel diode device has been provided by this invention which may be particularly adapted for operation at high electrical frequencies. In addition, the electrode structure provides for very low inductance and good mechanical strength. Suitable operating connections may be very conveniently made to the appropriate metal layers at a region of the device remote from the small area P-N junction to assure that no damage occurs thereto. Such connection may be made in any convenient manner as, for example, by clamping the device directly to the appropriate circuitry. This arrangement is particularly suitable for high frequency applications in which resonant cavities are utilized rather than lumped inductances and capacitances. In addition, further evaporated connections may be conveniently made to the external circuit when the device is intended for utilization in printed circuit applications and in particular for printed circuitry of the microminiaturization type.

While only certain preferred features of this invention have been shown by way of illustration, many modifications and changes will occur to those skilled in the art. It is, therefore, to be understood that the appended claims are intended to cover all such modifications and changes as fall within the true spirit and scope of this invention.

What I claim as new and desire to secure by Letters Patent of the United States is:

1. In a P-N junction semiconductor device of the tunnel diode type wherein the current at low voltages is determined essentially by the quantum mechanical tunneling process, said device including a heavily impregnated semiconductor body of one-type conductivity having formed within a first surface-adjacent portion thereof a small area regrown region of heavily impregnated opposite-type conductivity, the combination comprising: a first deposited metal layer in nonrectifying contact with said first surface of said body surrounding said regrown region, said metal layer having an aperture therein of sufficient size to prevent electrical conduction between said regrown region and said metal layer; a dielectric layer deposited upon said metal layer and upon the portion of the first surface of said semiconductor body not covered by said first metal layer; and a second continuous metal layer deposited upon said dielectric layer and upon said regrown region, said second metal layer thereby being in intimate contact with said regrown region and separated from said first metal layer by said dielectric layer.

2. The semiconductor device of claim 1 wherein the capacitance due to the deposited layers is made small compared to the capacitance of the narrow P-N junction of said device.

3. In a semiconductor diode device of the type wherein a regrown region of one-type conductivity having an alloyed button protruding therefrom is formed in a surface-adjacent region of a semiconductor body of opposite-type conductivity and in which the concentration of impurity in the regions of different conductivity type is sufficiently high to provide a narrow P-N junction space charge region therebetween which allows for the current at low voltages to be determined essentially by the quantum mechanical tunneling process, the combination with said device of a first metal layer deposited upon the surface of said semiconductor body from which said alloyed button protrudes, said metal layer having an aperture therein in the region of said alloyed button to prevent electrical conduction therebetween; a dielectric layer deposited upon a selected portion of said metal layer and that portion of said semiconductor surface not covered thereby; and a second metal layer deposited upon said dielectric layer and said alloyed button to provide said device with large area electrodes in contact with said alloyed button and with the bulk of said semiconductor body respectively.

4. A semiconductor device comprising: a semiconductor body of one-type conductivity; a regrown region of opposite-type conductivity within a surface-adjacent portion of said body, the concentration of impurity in said body and in said regrown region being sufficiently high that the P-N junction space charge region therebetween has a width such that the current at low voltages is determined essentially by the quantum mechanical tunneling process; a first metal layer deposited upon the surface of said body within which said regrown region is formed and being out of contact with said regrown region; a dielectric layer deposited upon said first metal layer and the surface of said semiconductor not covered thereby; and a second continuous metal layer deposited upon said dielectric layer and upon said regrown region.

5. A semiconductor device comprising: a semiconductor body of one-type conductivity having therein a small area regrown region of opposite-type conductivity with a larger area high resistivity region adjacent thereto, the concentration of excess impurity in said body and in said regrown region being sufficiently high that the P-N junction space charge region therebetween has a width which allows the current at low voltages to be determined essentially by the quantum mechanical tunneling process; a first deposited metal layer in non-rectifying contact with the surface of said body surrounding said high resistivity region; a dielectric layer disposed on the surface of said metal layer; and a second continuous deposited metal layer in intimate contact with said dielectric layer, said high resistivity region and said regrown region, said first and second metal layers thereby forming broad area electrodes for said device which are separated from each other by said dielectric layer.

6. The semiconductor device of claim 5 wherein the dielectric layer is composed of the oxidized surface of said first metal layer.

7. The semiconductor device of claim 5 wherein the capacitance due to the deposited layers is small compared to the capacitance of the P-N junction of said device.

8. A semiconductor device comprising: a semiconductor body of one-type conductivity; a regrown region of opposite-type conductivity within a surface-adjacent portion of said body, the concentration of impurity in said body and in said region being sufficiently high to render each of said regions at least approximately degenerate such that the P-N junction space charge region therebetween is very narrow and the current at low voltages is determined essentially by the quantum mechanical tunneling process; a first metal layer out of electrical contact with said regrown region deposited upon the surface of said body within which said regrown region is formed; a dielectric layer deposited upon a selected portion of said metal layer and the portion of the surface of said body not covered thereby; a second continuous metal layer deposited upon said dielectric layer and said regrown region, said first and second metal layers providing large area electrodes for said device.

9. The semiconductor device of claim 8 wherein the capacitance of said deposited layers is small compared to the capacitance of the P-N junction of said device.

10. A semiconductor device comprising: a semiconductor body of one-type conductivity; a regrown region of opposite-type conductivity within a surface-adjacent portion of said body, the respective concentration of impurity in said body and in said regrown region being sufficiently high that one of said regions is rendered degenerate and the other of said regions is rendered approximately degenerate such that the current in said device at low voltages is determined essentially by the quantum mechanical tunneling process; a first metal layer deposited upon the surface of said body within which said regrown region is formed and being out of contact with said regrown region; a dielectric layer deposited upon a selected portion of said first metal layer and the surface of said semiconductor not covered thereby; and a second continuous metal layer deposited upon said dielectric layer and upon said regrown region.

References Cited in the file of this patent

UNITED STATES PATENTS

| | | |
|---|---|---|
| 2,680,220 | Starr et al. | June 1, 1954 |
| 2,781,480 | Mueller | Feb. 12, 1957 |
| 2,972,092 | Nelson | Feb. 14, 1961 |
| 2,989,669 | Lathrop | June 20, 1961 |